United States Patent [19]
Foote

[11] Patent Number: 5,909,660
[45] Date of Patent: Jun. 1, 1999

[54] SIGNAL CONDITIONING MODULE FOR SENSING MULTIFORM FIELD VOLTAGE SIGNALS

[75] Inventor: Garritt W. Foote, Austin, Tex.

[73] Assignee: National Instruments Corporation, Austin, Tex.

[21] Appl. No.: 08/951,808

[22] Filed: Oct. 16, 1997

Related U.S. Application Data

[63] Continuation of application No. 08/322,774, Oct. 13, 1994, abandoned.

[51] Int. Cl.$^6$ ........................................................ G06F 3/00
[52] U.S. Cl. ............................ 702/189; 702/64; 327/309; 327/322
[58] Field of Search ........................ 395/200.6; 324/126; 326/62, 68, 82; 364/556; 361/5, 6, 7; 250/551; 330/258; 327/63, 100, 309, 315, 321, 322, 325; 702/57, 62, 64, 65, 107, 116, 117, 120, 124, 126, 189, 190, 197, 198; 323/315, 902, 908

[56] References Cited

U.S. PATENT DOCUMENTS

| | | | |
|---|---|---|---|
| 4,327,321 | 4/1982 | Suzuki et al. | 323/315 |
| 4,873,448 | 10/1989 | Shirai | 250/551 |
| 4,926,363 | 5/1990 | Nix | 702/120 |
| 5,083,288 | 1/1992 | Somlyody et al. | 702/116 |
| 5,418,450 | 5/1995 | Bacon | 324/110 |

OTHER PUBLICATIONS (1994) IEEE 488 and VXIbus Control, Data Acquisition, and Analysis, SCXI 32–Channel Optically Isolated Digital Input/Output Modules, National Instruments, 1993, pp. 3–161—3–163. (No date with month).

Grayhill, An ISO–9001 Company, Control Products Catalog, AC Input Module, Grahill Corp., pp. 32, 33, (No date).

Gordos Off–the–Shelf Distributor Catalog, Revised Apr. 1987, DC Input Module, Gordos Corp., pp. 4, 34, 35.

*Primary Examiner*—James P. Trammell
*Assistant Examiner*—Hal Dodge Wachsman
*Attorney, Agent, or Firm*—Conley, Rose & Tayon; Jeffrey C. Hood

[57] ABSTRACT

A signal conditioning module for sensing multiform field signals and for providing isolated digital signals appropriate for a processing system. The present invention allows sensing of field signals which are either AC or DC and which have magnitudes ranging from zero to greater than 240 volts in the preferred embodiment. A circuit according to the present invention includes a bidirectional maximum current limiter coupled to a bidirectional isolation current sensor. The current sensor preferably includes an opto-coupler. The current limiter preferably includes cross-coupled depletion mode devices and a current limit resistor. In this manner, current flowing through the resistor develops a voltage for turning off one depletion mode device or the other depending upon the polarity of the current, so that the input current is limited to a predetermined maximum level for a wide voltage range of input signals and regardless of voltage polarity. The opto-coupler preferably includes cross-coupled LEDs for sensing current in either direction. An AC smoothing filter is provided at the output to filter AC signals for providing a smooth digital output signal.

22 Claims, 3 Drawing Sheets

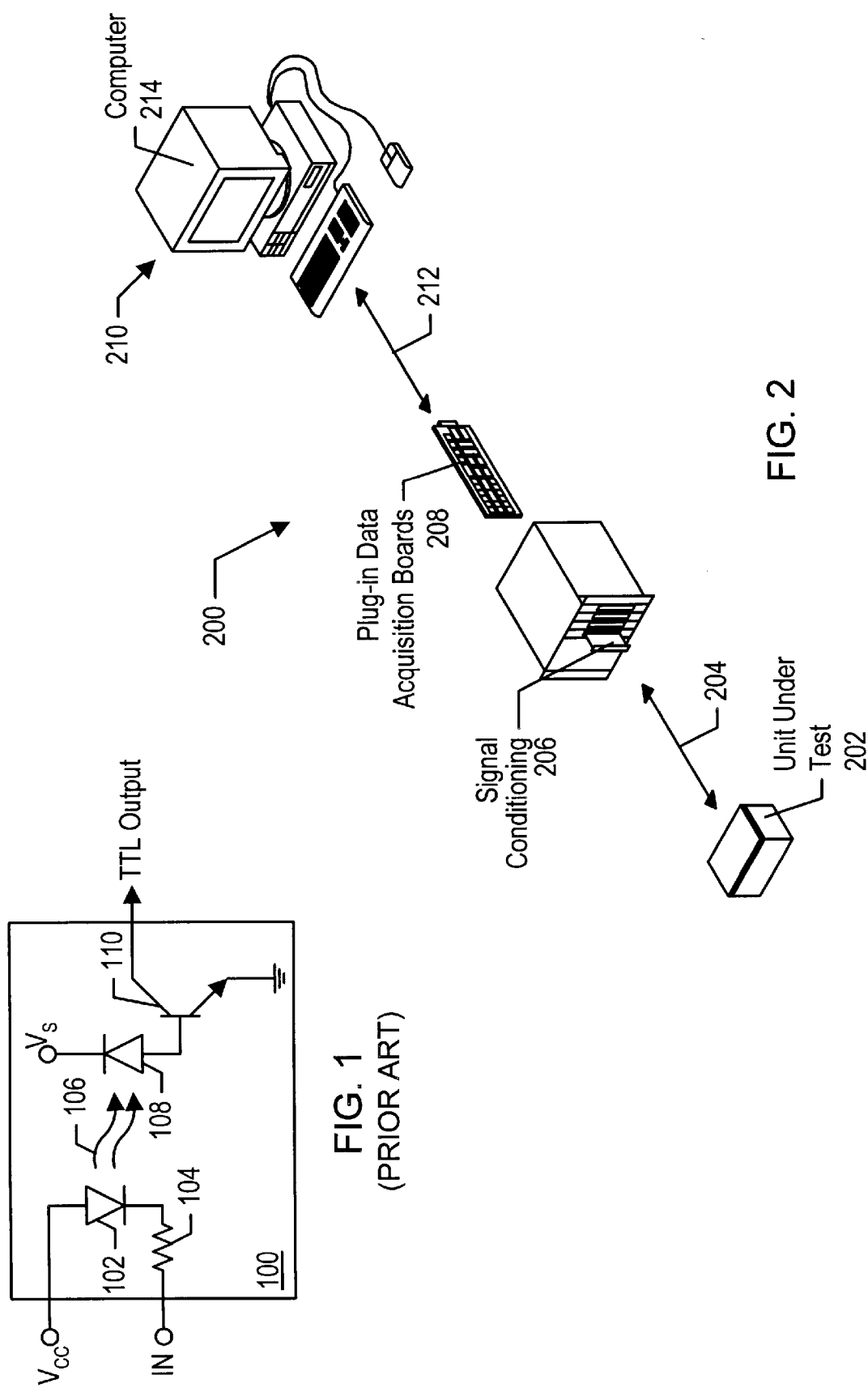

SIGNAL CONDITIONING MODULE FOR SENSING MULTIFORM FIELD VOLTAGE SIGNALS

This application is a continuation, of application Ser. No. 08/322,774, filed Oct. 13, 1994, now abandoned.

FIELD OF THE INVENTION

The present invention relates to conditioning signals, and more particularly to sensing and isolating field voltage signals having any one of a variety of forms and for providing a corresponding digital signal appropriate for instrumentation systems.

DESCRIPTION OF THE RELATED ART

Scientists and engineers often use measurement or instrumentation systems to perform a variety of functions, including laboratory research, process monitoring and control, data logging, analytical chemistry, test and analysis of physical phenomena, control of mechanical or electrical machinery, to name a few examples. An instrumentation system typically includes transducers and other detecting means for providing "field" electrical signals representing a process, physical phenomena, equipment being monitored or measured, etc. For example, detectors and/or sensors are used to sense the on/off state of power circuits, proximity switches, pushbutton switches, thermostats, relays or even the presence of positive or negative digital logic-level signals. The instrumentation system further includes interface hardware for receiving the measured field signals and providing them to a processing system, such as a personal computer. The processing system typically performs data analysis and presentation for appropriately analyzing and displaying the measured data.

Often, the field signals may be coupled to high common-mode voltages, ground loops, or voltage spikes that often occur in industrial or research environments which could damage the computer system. In that case, the instrumentation system typically includes isolation circuitry such as opto-couplers for eliminating ground-loop problems and isolating the computer from potentially damaging voltages. Digital signal input modules are typically provided for conditioning the raw field voltage signals by amplifying, isolating, filtering or otherwise converting the signals to the appropriate digital signals for the computer system. In one embodiment, the digital signals are then provided to a plug-in data acquisition (DAQ) input/output (I/O) board, which is plugged into one of the I/O slots of a computer system. Generally, the computer system is an IBM-compatible computer system having an I/O bus and connectors or slots for receiving I/O boards. Of course, other computer systems and I/O buses may be used to implement a processing system.

In conventional instrumentation systems, the digital input modules were very limited and could only receive certain types of signals. Thus, many different types of digital input modules were required if several different forms of field signals had to be sensed or monitored. The reason for the multiple forms of the field signals being sensed is primarily due to differences in voltage, current and polarity. For example, TTL or CMOS (complimentary metal-oxide semiconductor) are generally low voltage DC signals, although high common-mode voltages may be present. The detection circuitry must be sophisticated enough to distinguish the logic state of such digital signals, where the signal is considered low or zero when 1 volt or less and is considered high when above approximately 2–2.5 volts, and to assert a corresponding filtered digital signal. Another digital input may be used to sense the presence of a high voltage DC signal, and yet another required for monitoring a high voltage AC signal. The isolation circuitry, which is necessary to eliminate high common-mode voltages and ground-loops, was particularized to sensing only certain types and forms of signals and was not suitable for other types. In general, each input was specialized to receive either AC or DC voltage signals, or to receive low, medium or high voltage levels. For example, input circuitry designed for receiving TTL or CMOS digital signals could not be used to detect a 240 AC voltage signal and vice-versa. In this manner, an instrumentation system monitoring a plurality of events had to include a plurality of inputs for sensing a variety of different types of field signals.

FIG. 1 illustrates a typical low voltage DC digital signal input module for instrumentation systems. A VCC input voltage supplied by the user, which is typically between five and ten volts, is provided through a light-emitting diode (LED) to a current limit resistor, which is typically several hundreds of Ohms. The other side of the current limit resistor receives the input or field signal referred to as the signal IN. The LED provides light signals detected by the base of a bi-polar type transistor, which has its emitter grounded and its collector providing an isolated output digital signal. The LED and current limit resistor are generally chosen for distinguishing low/high voltage levels of TTL or CMOS digital signals. Higher voltages can be detected by the circuit of FIG. 1 if the resistance value of the current limit resistor is significantly increased, depending upon the voltage level expected. However, such modification of the current limit resistor reduces or even eliminates the ability to detect and distinguish lower voltage levels. As is common practice, commercially available solid state relay inputs are provided for a variety of relatively narrow voltage ranges, which are generally ineffective and unreliable for use outside the specified range. Therefore, a given solid state relay input might be sufficient for up to ten volts, but is insufficient for detecting DC voltages up to 240 volts and vice-versa.

Another limitation of the circuit shown in FIG. 1 is that it is limited to DC voltages in general. The internal LED conducts current in only one direction so that a bidirectional or AC voltage signal cannot be directly connected to the input circuitry shown in FIG. 1. In practice, different AC input logic is used for receiving AC signals.

Therefore, it is desired to provide a signal conditioning module for sensing and isolating multiform field voltage signals having one of a variety of forms. In this manner, the same signal conditioning input circuitry is used for DC, AC or bidirectional signals having a wide voltage range, thereby simplifying the instrumentation system and enhancing efficiency.

SUMMARY OF THE INVENTION

A signal conditioning module for sensing multiform field voltage signals according to the present invention includes a bidirectional maximum current limiter coupled to a bidirectional isolation current sensor for asserting a digital signal indicative of the field voltage signal. In the preferred embodiment, the current sensor comprises an opto-coupler including cross-coupled LEDs. An AC smoothing filter is preferably provided at the output of the opto-coupler for converting AC signals to DC. The current limiter preferably comprises dual-coupled high voltage depletion mode metal-oxide semiconductor field-effect transistors (MOSFETs) for detecting large voltages while limiting the current provided to the opto-coupler LEDs to a predetermined maximum level. Preferably, the MOSFETs are rated up to 400–500 volts. The use of depletion mode devices allows sufficient current flow even at small voltages. In this manner, a large voltage range is detected by a signal conditioning module according to the present invention.

In the preferred embodiment, the source of each depletion mode MOSFET is coupled to the gate of the opposing MOSFET, and a current limiter resistor is coupled between the sources of the MOSFETs. In this manner, current flowing in either direction through the MOSFETs and through the current limiting resistor develops a voltage across the resistor which tends to turn one MOSFET off while the other MOFSET continues to conduct through its intrinsic backbody p-n junction, thereby limiting the current to a maximum level even with a significantly high level of voltage and regardless of the direction of the current provided at the input. The value of the current limit resistor is chosen to detect and distinguish switching voltages of TTL and CMOS low voltage DC input signals. Furthermore, this dual configuration is capable of detecting AC or bidirectional voltage signals. The AC smoothing filter provided at the output of the opto-coupler provides a DC digital signal in the event an AC or bidirectional signal is provided at the input. In particular, the emitter of the opto-coupler output transistor is coupled through an R/C (resistor-capacitor) circuit and the collector is coupled to +5 V. Thus, current flowing in either direction through the dual coupled LEDs is filtered through the R/C circuit, thereby providing an appropriate DC digital signal for the DAQ circuitry.

In the preferred embodiment, 8 ports each including four separate channels are included in a signal conditioning system according to the present invention. Each port is coupled to a ground signal provided by the user, where the four channels of the port preferably share a single ground input. The data is provided to a data register, which provides the data to either a parallel or serial interface.

In this manner, a signal conditioning module according to the present invention senses multiform field voltage signals. A field signal may either be AC or DC and have a voltage ranging from a low voltage level to a relatively high voltage level, such as 240 V, and provides an appropriate digital logic signal to a computer system for processing. The opto-coupler provides the appropriate isolation for removing the danger of common mode voltages, voltage spikes or ground loop problems. The present invention eliminates the need for different circuitry for each field signal to be sensed, thereby simplifyring and improving the efficiency of a signal conditioning system.

BRIEF DESCRIPTION OF THE DRAWINGS

A better understanding of the present invention can be obtained when the following detailed description of the preferred embodiment is considered in conjunction with the following drawings, in which:

FIG. 1 is a schematic diagram of a digital isolation input according to prior art;

FIG. 2 is a perspective diagram of an instrumentation system including a signal conditioning system according to the present invention;

DETAILED DESCRIPTION OF THE PREFERRED EMBODIMENT

Figure 3:
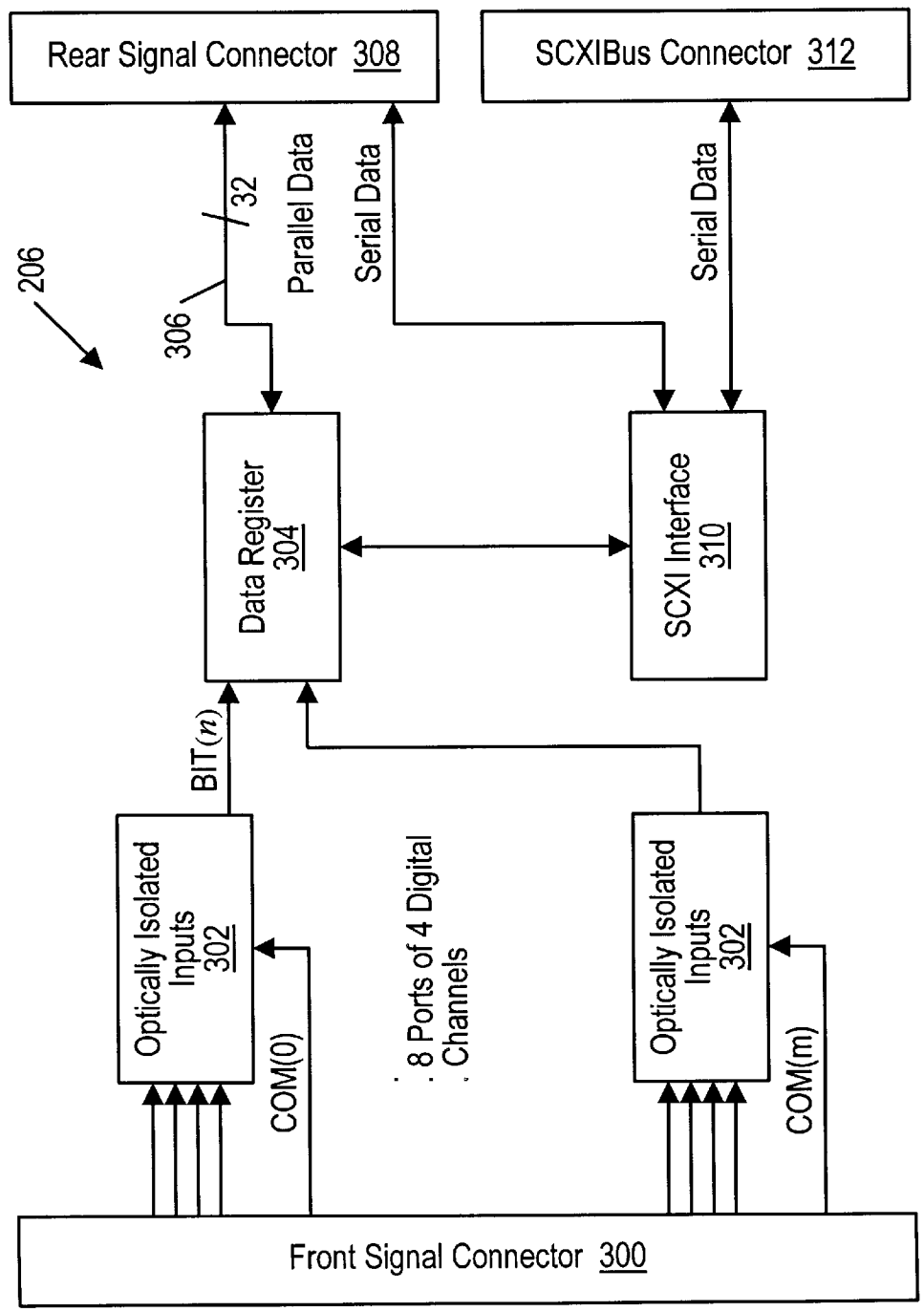
FIG. 3 is a simplified block diagram of the signal conditioning system of FIG. 2.

FIG. 1 is a schematic diagram illustrating a DC digital signal input circuit 100 according to prior art. A user or operator provides a reference voltage referred to as VCC, which is preferably between 5 to 10 volts (V), to the anode of a light-emitting diode (LED) 102. The cathode of the diode 102 is connected to one end of a series current limiting resistor 104, which receives a field input signal IN at its other end. The LED 102 and resistor 104 form the input portion of an opto-coupler isolation circuit, capable of receiving digital signals including TTL and CMOS, preferably up to 5 to 10 V. Current through the LED 102 generates light signals 106 received by the base of an internal bi-polar type transistor 110 of the opto-coupler. The emitter of the transistor 110 is coupled to ground and its collector provides a TTL digital output signal. The base of the transistor 110 is preferably coupled to the anode of a diode 108, which has its cathode coupled to a signal VS, which is also preferably approximately 5–10 V.

In operation, the user supplies the VCC signal and the IN signal is provided from a process being monitored. If the IN signal is near zero volts or below the VCC signal by a predetermined amount, current flows through the LED 102 as limited by the resistor 104, where the LED 102 generates light signals 106 received by the transistor 110. The transistor conducts, pulling the TTL output signal low. If the input signal IN has a voltage relatively close to that of the VCC signal so that the voltage across the VCC and IN inputs is less than a certain predetermined voltage, the light signals 106 are not generated so that the transistor 110 is turned off. Preferably, the TTL output signal is pulled high through an external pull-up resistor (not shown). The diode 108 prevents the voltage at the base of the transistor 110 from rising above the $V_S$ signal, thereby preventing change to the transistor 110. In this manner, the TTL output signal generates a digital signal representative of the monitored IN signal.

It is first noted that the IN signal should not rise significantly above the VCC signal, since otherwise damage could occur to the LED 102 or the resistor 104. Thus, the digital signal module 100 is designed to detect signals having a voltage range between 0 and VCC, thereby detecting unidirectional or otherwise DC voltage signals. The current limiting resistor 104 is usually a low value, preferably several hundreds of Ohms, if a TTL or CMOS digital signal is expected on the IN signal. If higher voltage levels are desired to be detected, the resistor 104 is increased in value to several thousands or even tens of thousands of Ohms or more to limit current. However, the digital signal module 100 would then be limited to high voltage signals and would not have the required sensitivity for lower voltage levels at the TTL or CMOS level. Therefore, the digital signal module 100 of prior art shown in FIG. 1 is limited. In practice, solid state relay inputs are commercially available similar to the digital signal module 100 having rated voltage levels and ranges. Such voltage ranges are limited and use is not recommended outside the specified range.

Referring now to FIG. 2, an instrumentation system 200 incorporating a signal conditioning module according to the present invention is shown. A unit under test (UUT) 202 generally represents a process or other physical phenomena being monitored including transducers or other sensing devices for detecting or measuring temperature, pressure, or voltage, etc. For example, it may be desired to sense the on/off state of power circuits, proximity switches, pushbutton switches, thermostats, relays or the presence of positive or negative digital logic-level signals. The sensing devices provide field signals across a bus 204 to a signal conditioning system 206 according to the present invention. The signal conditioning system 206 generally isolates the field signals and otherwise amplifies, reduces, or filters the field signals and provides corresponding digital signals to a DAQ board 208, which is further coupled to a computer system 210 through its input/output (I/O) bus 212.

The DAQ board 208 includes the appropriate circuitry for collecting all of the data provided by the signal conditioning system 206 and providing this data on the I/O bus 212 of the computer system 210. The computer system 210 includes the appropriate software for performing analysis of the collected data and a display 214 for displaying the analyzed data in a desirable format.

In the preferred embodiment, the signal conditioning system 206 includes a plurality of channels where each channel receives a field signal from the UUT 202. Each of the field signals may have one of a variety of different forms based on voltage and current levels as well as polarity. For example, the field signals could be digital logic signals such as TTL and CMOS, or could be AC or DC signals with large voltage levels. Since the field signals typically include high common-mode voltages, they must be isolated from the computer system 210. Thus, the signal conditioning system 206 isolates the field signals to eliminate ground-loop problems which would otherwise expose the computer system 210 to high voltages.

Referring now to FIG. 3, a simplified block diagram is shown of the signal conditioning system 206 of FIG. 2. The system 206 includes a front signal connector 300 for coupling to the bus 204 for receiving field signals IN(n) from the UUT 202, where n preferably ranges between 0 and 31. In the preferred embodiment, the front signal connector 300 includes a plurality of conductors for coupling to eight ports 302, where each port 302 includes four channels each comprising a signal conditioning module according to the present invention. In the preferred embodiment, each of the eight ports 302 are connected to a signal COM (m), which is common to each of the four channels of the port 302, where m preferably ranges from 0 to 7. Preferably, each COM(m) signal is coupled to chassis ground provided by the user or from the UUT 202. Each of the channels of the ports 302 provide digital output signals BIT(n) representing the field signals to a data register 304, each of the BIT(n) signals correspond to the IN(n) signals. Data is transferred in parallel format through a 32-bit bus 306 to a rear signal connector 308, which further provides digital signals to the DAQ 208. For retrieving the data serially, an SCXI (signal conditioning extension for instrumentation) interface 310 is coupled to the data register 304, which manages the flow of data from the data register 304 in a serial manner, either to the rear signal connector 308 or to an SCXI bus connector 312.

Figure 4:
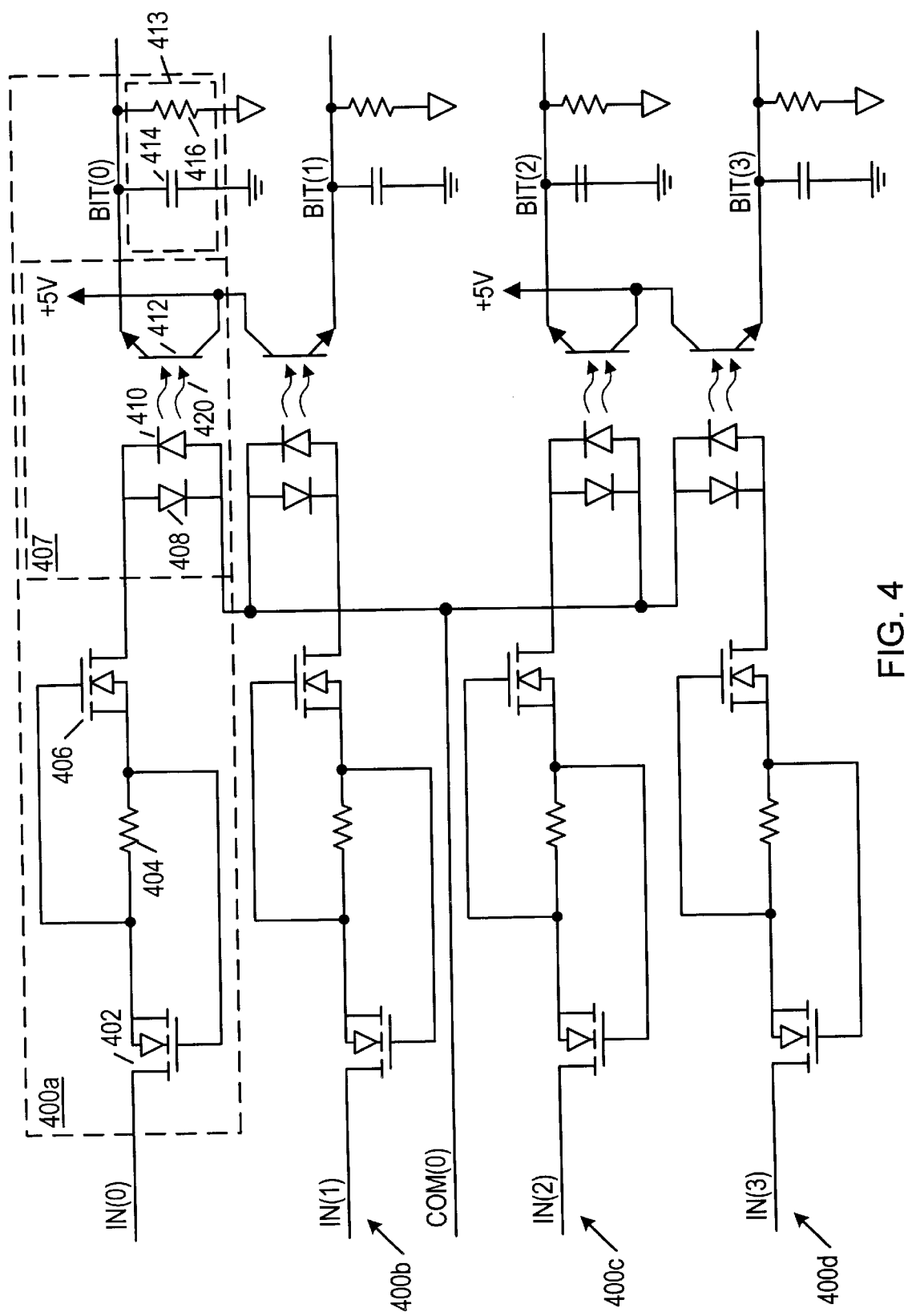
FIG. 4 is a more detailed schematic diagram of an input port of the signal conditioning system of FIG. 2.

Referring now to FIG. 4, a more detailed schematic diagram is shown of a first port 302, which preferably includes four signal conditioning modules 400a, 400b, 400c and 400d according to the present invention, each preferably coupled to the COM(0) signal as shown. Preferably, each port 302 is similar so that only one will be described, it being representative of the others. Further, each of the signal conditioning modules 400a–400d are preferably similar so that only one will be described. An input signal IN(0) provided from the UUT 202 is provided to the drain of a depletion mode metal-oxide semiconductor field-effect transistor (MOSFET) 402, having its source connected to one end of a current limit resistor 404, or other suitably resistive device. The source of the MOSFET 402 is also connected to the gate of another depletion mode MOSFET 406, which is very similar to the MOSFET 402. The MOSFETs 402, 406 are preferably high voltage depletion type devices capable of handling voltages greater than 240 volts, and preferably up to 400–500 volts, such as the LNDIE manufactured by Supertex. It is understood that other depletion mode devices having an appropriate voltage ratings could be used. The other end of the resistor 404 is connected to the source of the MOSFET 406 and also to the gate of the MOSFET 402.

The drain of the MOSFET 406 is connected to the input portion of a bidirectional opto-coupler 407, which is preferably the LDA210 manufactured by CP Clare Corp. The opto-coupler 407 serves as a bi-directional current sensor for sensing current through the MOSFETs 402, 406. It is understood that other bidirectional isolation sensors could be used, such as an isolation transformer or the like. Optical isolation is preferred, however. The drain of the MOSFET 406 is coupled to the anode of a light-emitting diode (LED) 408 and also to the cathode of another LED 410. The cathode of the LED 408 and the anode of the LED 410 are connected to the COM(0) signal. The output portion of the opto-coupler 407 includes a bi-polar type transistor 412 having its collector coupled to a digital reference signal and its emitter providing a digital output signal BIT(0). The reference voltage shown is a 5 volt signal referred to as +5 V, although other digital reference voltage levels are contemplated. The BIT(0) signal is preferably filtered through an AC smoothing filter 413, which preferably includes a capacitor 414 and a resistor 416 coupled in parallel between the BIT(0) signal and ground. In a similar manner, each of the signal conditioning modules 400b, 400c and 400d receive input signals IN(1), IN(2) and IN(3) and provide output signals BIT(1), BIT(2) and BIT(3).

Operation of the signal conditioning module 400a is as follows. The transistor 412 is initially off with no signal asserted on the IN(0) signal, so that the BIT(0) signal is pulled low to ground through resistor 416. If the IN(0) signal goes positive, a current begins to flow through the drain and source terminals of the MOSFETs 402, 406 and through the resistor 404. When the voltage at the IN(0) signal exceeds a certain voltage level, such as 2 V, the diode 408 begins to generate light signals 420, which are received by the base of the transistor 412 of the opto-coupler 407. The output BIT(0) signal is pulled high when the transistor 412 is turned on since coupled through the +5 V signal, thereby asserting the BIT(0) signal high. As the voltage of the IN(0) signal begins to increase above 2 volts up to a preferred maximum of 240 V, a voltage develops across the current limit resistor 404 causing the gate of the MOSFET 402 to go more negative than its source, tending to turn off the MOSFET 402. The MOSFET 402 does not shut completely off, but limits the current flowing through the resistor 404 and thus through the LED 408 to a maximum of approximately 1 milliamp (mA). Of course, the value of the resistor 404 is chosen to achieve any acceptable maximum current level. In this manner, the voltage of the IN(0) signal can range anywhere from 2–240 V causing switching action of the opto-coupler 407 to assert the BIT(0) signal high, without damaging the signal conditioning module 400a.

If the IN(0) signal is negative, having a magnitude of 2 V or greater, a negative current flows through the MOSFETs 402, 406, the resistor 404, and the diode 410, thereby generating similar light signals 420, turning the transistor 412 on. A negative voltage develops at the gate of the MOSFET 406 relative to its source, thereby tending to turn off the MOSFET 406 and limiting the current to a maximum of approximately 1 mA even if the voltage of the IN(0) signal reaches −240 V. If the magnitude of the IN(0) signal is between 2–240 VRMS, the transistor 412 is turned on, thereby asserting the BIT(0) signal high. Thus, operation is the same regardless of polarity of the input signal.

In the preferred embodiment, the depletion mode MOSFETs 402, 406, the current limit resistor 404 and the bidirectional opto-coupler 407 are chosen to accept and detect switching levels of either TTL or CMOS digital field signals provided on the IN(0) signal.

Preferably, the resistor 404 is several hundred Ohms, and more particularly 560 Ohms, and the MOSFETs 402, 406 are rated at approximately 400–500 volts each. In this manner, a DC field signal having a voltage magnitude of less than or equal to approximately 1 V causes the signal conditioning module 400a to assert a logic low on the BIT(0) signal. If the DC IN(0) signal reaches 2 volts of more, the BIT(0) signal is asserted high. This meets the switching requirement of both CMOS and TTL logic, as known to those skilled in the art. Due to the high voltage rating and current limit functions of the MOSFETs 402, 406 and the resistor 404, the DC voltage level can be as high as 400–500 volts without damaging the signal conditioning module 400a. In the preferred embodiment, however, the recommended maximum is 240 volts. Furthermore, the same analysis applies to negative voltages, so that the signal conditioning module 400a can receive DC voltages up to −400 to −500 volts. However, it is preferred not to exceed −240 volts.

If the magnitude of the voltage of the IN(0) signal does not exceed 1 V, sufficient current does not flow through the LEDs 408, 410 or the resistor 404, so that the transistor 412 remains off. Thus, the BIT(0) signal is asserted low as long as the magnitude of the input signal IN(0) does not exceed 1 V for all frequencies. For higher voltages and frequencies, the AC smoothing filter 413 tends to smooth out the voltage on the BIT(0) signal so that it remains constantly on. In particular, a voltage develops across the capacitor 414 so that the BIT(0) signal remains asserted in spite of the fact that an AC signal is being asserted on the IN(0) signal. Thus, if an AC signal is asserted on the IN(0) signal having a voltage magnitude of at least 2 VAC and a frequency of approximately 1 KHz or higher, the BIT(0) signal is asserted high. For lower frequencies at or below approximately 100 Hz, the BIT(0) signal is asserted high when the magnitude of the AC voltage reaches or exceeds 10 VAC. Below 10 V, however, the BIT(0) signal may toggle since the capacitor 414 alternatively charges/discharges. Typically, however, an AC voltage being sensed at 50–60 Hz has a voltage level greater than 10 VAC, such as 110–120 or 240 VAC.

It can now be appreciated that a signal conditioning module according to the present invention senses multiform field voltages including either AC or DC signals having voltage levels ranging from 1–240 volts. Optical isolation protects a computer system from large common-mode voltages, ground loops and voltage spikes that often occur in industrial and research environments. This allows a simplified signal conditioning system since each input module comprises the same or very similar circuitry. This further allows increased efficiency at reduced cost.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A signal conditioning module for detecting a field signal and for providing a corresponding electrically isolated digital output signal representative of the field signal, comprising:
   a bidirectional maximum current limiter; and
   a bidirectional isolation current sensor coupled to said current limiter for detecting current through said current limiter and for providing the corresponding digital output signal;
   wherein the bidirectional maximum current limiter enables said signal conditioning module to receive signals of different types for isolation by the bidirectional isolation current sensor.

2. The signal conditioning module of claim 1, further comprising an AC smoothing filter coupled to said current sensor for converting AC signals to DC.

3. The signal conditioning module of claim 2, wherein said AC smoothing filter comprises a resistor-capacitor circuit.

4. The signal conditioning module of claim 1, wherein said current limiter comprises:
   a first depletion mode device having a current path and a gate;
   a resistive device having a first end coupled to said current path of said first depletion mode device and a second end coupled to said gate of said first depletion mode device; and
   a second depletion mode device having a current path coupled to said second end of said resistive device and a gate coupled to said first end of said resistive device.

5. The signal conditioning module of claim 4, wherein said first and second depletion mode devices have a voltage rating greater than 240 V.

6. The signal conditioning module of claim 4, wherein said first and second depletion mode devices limit current to approximately 1 milliamp.

7. The signal conditioning module of claim 4, wherein said first and second depletion mode devices are depletion mode MOSFETs.

8. The signal conditioning module of claim 1, wherein said current limiter comprises:
   a first depletion mode MOSFET;
   a resistor having a first end coupled to the source and a second end coupled to the gate of said MOSFET; and
   a second depletion mode MOSFET having its source coupled to said second end of said resistor, its gate coupled to said first end of said resistor and its drain coupled to said current sensor.

9. The signal conditioning module of claim 1, wherein said current sensor comprises a bidirectional optocoupler.

10. The signal conditioning module of claim 9, wherein said optocoupler has an input portion comprising a pair of cross coupled light-emitting diodes.

11. The signal conditioning module of claim 10, wherein said optocoupler includes an output portion comprising a transistor having a base for sensing light signals.

12. The signal conditioning module of claim 9, wherein said optocoupler includes a transistor having its collector coupled to a digital reference signal and its emitter providing said digital output signal.

13. The signal conditioning module of claim 12, further comprising an AC smoothing filter coupled to the emitter of said transistor.

14. The signal conditioning module of claim 13, wherein said AC smoothing filter comprises a resistor-capacitor circuit.

15. A signal conditioning system for sensing a plurality of field signals and for providing a corresponding plurality of isolated digital signals, comprising:

a plurality of signal conditioning modules, each of said signal conditioning modules for sensing one of said plurality of field signals and for providing a corresponding isolated digital signal, wherein each said modules comprises:

a bidirectional maximum current limiter; and a bidirectional isolation current sensor coupled to said current limiter for detecting current through said current limiter and for providing said corresponding isolated digital signal;

wherein the bidirectional maximum current limiter enables said module to receive signals of different types for isolation by the bidirectional current sensor; and a data register coupled to said plurality of signal conditioning modules for receiving said isolated digital signals and for providing data in parallel format.

16. The signal conditioning system of claim 15, further comprising a parallel to serial interface for converting and providing said data in a serial format.

17. The signal conditioning system of claim 15, wherein said current limiter comprises:

a first depletion mode device having a current path and a gate;

a resistive device having a first end coupled to said current path of said first depletion mode device and a second end coupled to said gate of said first depletion mode device; and a second depletion mode device having a current path coupled to said second end of said resistive device and a gate coupled to said first end of said resistive device.

18. The signal conditioning system of claim 15, wherein said current sensor comprises a bidirectional optocoupler.

19. The signal conditioning system of claim 15, further comprising an AC smoothing filter coupled to said current sensor for converting AC signals to DC.

20. An instrumentation system for sensing a plurality of field signals, comprising:

a signal conditioning system comprising:

a plurality of signal conditioning modules, each of said signal conditioning modules for sensing one of said plurality of field signals and for providing a corresponding isolated digital signal, wherein each of said modules comprises:

a bidirectional maximum current limiter; and a bidirectional isolation current sensor coupled to said current limiter for detecting current through said current limiter and for providing said corresponding isolated digital signal;

wherein the bidirectional maximum current limiter enables said module to receive signals of different types for isolation by the bidirectional isolation current sensor;

a data register coupled to said plurality of signal conditioning modules for receiving said digital signals and for providing data in parallel format;

a processing system including an input/output bus for receiving, analyzing and displaying said data; and a data acquisition device coupled to said signal conditioning system and said input/output bus of said processing system for receiving said data and providing said data to said processing system.

21. A signal conditioning system for sensing a plurality of field signals and for providing a corresponding plurality of isolated digital signals, comprising:

a common terminal;

a plurality of field signal input terminals for receiving a plurality of field signals; and a plurality of signal conditioning modules each connected to one of the plurality of field signal input terminals, each of said modules being configured to sense one of said plurality of field signals and to provide a corresponding isolated digital signal, wherein each of said modules further comprises;

a bidirectional maximum current limiter;

a bidirectional isolation current sensor coupled in series to said current limiter for detecting current through the current limiter and for providing said corresponding isolated digital signal, each of the current sensors including a bidirectional optocoupler having an input portion comprising a pair of cross coupled light-emitting diodes connected to the common terminal.

22. The signal conditioning system of claim 21, wherein each of said modules further comprises an AC smoothing filter coupled to said current sensor for smoothing said corresponding isolated digital signal to a constant digital value in response to AC field signals.

* * * * *